US008242629B2

(12) United States Patent
Palatini et al.

(10) Patent No.: US 8,242,629 B2
(45) Date of Patent: Aug. 14, 2012

(54) HYBRID LOAD SYSTEMS INCLUDING A DYNAMIC ELECTRONIC LOAD AND PASSIVE RESISTIVE LOAD MODULES

(75) Inventors: Lance Palatini, Morris Plains, NJ (US); Kevin O'Connor, Henryville, PA (US); Andrew Lysiak, Netcong, NJ (US)

(73) Assignee: Transistor Devices, Inc., Hackettstown, NJ (US)

( * ) Notice: Subject to any disclaimer, the term of this patent is extended or adjusted under 35 U.S.C. 154(b) by 0 days.

(21) Appl. No.: 12/364,871

(22) Filed: Feb. 3, 2009

(65) Prior Publication Data

US 2010/0194424 A1    Aug. 5, 2010

(51) Int. Cl.
*H02M 3/06* (2006.01)

(52) U.S. Cl. ............. 307/31; 307/34; 307/38; 307/112; 307/113; 307/115

(58) Field of Classification Search .................... 307/31, 307/34, 38, 112, 113, 115
See application file for complete search history.

(56) References Cited

U.S. PATENT DOCUMENTS

| | | | | |
|---|---|---|---|---|
| 4,042,830 A * | 8/1977 | Kellenbenz et al. ............ | 307/40 |
| 4,288,739 A | 9/1981 | Nercessian | |
| 4,357,574 A | 11/1982 | Takamisawa et al. | |
| 4,445,047 A | 4/1984 | Cannon | |
| 5,122,968 A * | 6/1992 | Bauer et al. ..................... | 702/58 |
| 5,512,831 A | 4/1996 | Cisar et al. | |
| 5,541,550 A | 7/1996 | Bohme | |
| 5,565,716 A | 10/1996 | Tierney, Jr. | |
| 5,703,582 A * | 12/1997 | Koyama et al. ............... | 341/120 |
| 5,917,331 A * | 6/1999 | Persons ......................... | 324/765 |
| 5,969,514 A * | 10/1999 | Merrill ........................... | 323/283 |
| 6,211,726 B1 * | 4/2001 | Daun-Lindberg et al. ..... | 327/536 |
| 6,297,688 B1 * | 10/2001 | Nakamura ..................... | 327/538 |
| 6,323,668 B1 * | 11/2001 | Hashimoto .................. | 324/750.3 |
| 6,324,042 B1 | 11/2001 | Andrews | |
| 6,339,338 B1 * | 1/2002 | Eldridge et al. ............... | 324/765 |
| 6,359,442 B1 * | 3/2002 | Henningson et al. ......... | 324/426 |
| 6,385,547 B1 * | 5/2002 | Bogli .............................. | 702/64 |
| 6,490,536 B1 | 12/2002 | Ellingboe et al. | |
| 6,504,395 B1 * | 1/2003 | Johnson ......................... | 324/765 |
| 6,697,245 B2 | 2/2004 | Andrews | |
| 7,112,988 B2 | 9/2006 | Xiao | |
| 7,436,200 B1 * | 10/2008 | Jacobsen et al. ......... | 324/764.01 |
| 7,466,156 B2 * | 12/2008 | Marsh et al. .................. | 324/763 |
| 7,643,263 B2 * | 1/2010 | Abudul Muthalib et al. ............................ | 361/93.1 |
| 7,675,310 B2 * | 3/2010 | Sullivan ........................ | 324/765 |
| 7,893,756 B2 * | 2/2011 | Pamperin et al. ............. | 327/543 |
| 2004/0036496 A1 | 2/2004 | Liu et al. | |
| 2004/0165329 A1 * | 8/2004 | Andrews ........................ | 361/100 |
| 2005/0134248 A1 | 6/2005 | Locker et al. | |
| 2006/0244456 A1 * | 11/2006 | Henningson et al. ......... | 324/378 |
| 2008/0150547 A1 | 6/2008 | Wong et al. | |
| 2008/0224710 A1 * | 9/2008 | Henningson .................. | 324/433 |

* cited by examiner

*Primary Examiner* — Adi Amrany (74) *Attorney, Agent, or Firm* — Doherty & Charney LLC (57) ABSTRACT

A hybrid load system includes a dynamic electronic load module, and a plurality of passive resistive modules coupled with the dynamic electronic load module. The hybrid system includes a control system in communication with the dynamic electronic load module and the passive resistive modules for determining when and how many of the passive resistive modules should be applied in parallel with the dynamic electronic load module for creating a desired load.

16 Claims, 8 Drawing Sheets

HYBRID LOAD SYSTEMS INCLUDING A DYNAMIC ELECTRONIC LOAD AND PASSIVE RESISTIVE LOAD MODULES

BACKGROUND OF THE INVENTION

1. Field of the Invention

The present invention generally relates to testing electronic circuits and power systems and more specifically relates to electronic load systems for testing electronic circuits and power systems.

2. Description of the Related Art

An electronic load system simulates loading on an electronic circuit. Electronic Loads are suitable for testing and characterizing a wide range of power sources, such as power supplies, batteries, generators, fuel cells, solar cells and other power components. Unlike passive resistive loads, which have a single pre-determined load current, electronic loads may operate under multiple modes such as constant current (CC), constant voltage (CV), constant power (CW) and constant resistance (CR), and offer a wide variety of voltage and current ranges. When using an electronic load, the load current may be varied within a defined range, and may be regulated electronically. Electronic loads may be used to simulate dynamic behaviors using a built-in transient generator and versatile triggering options to allow the dynamic load behavior to be synchronized with other events.

The equipment and power spectrum of electronic loads begins with simple circuits including a potentiometer for current setting and a transistor circuit for power transforming. During operation, the electronic load consumes electric energy and transforms it into heat energy. Fans or water-cooled elements may be used for cooling the system. Settings and measured values such as input voltage and actual load current are typically shown on a visual display. Electronic load systems may be controlled by a PLC or remotely by a PC.

A dynamic electronic load module typically uses a plurality of relatively expensive field effect transistor (FET) circuits that enables the module to operate under a wide variety of voltage and current ranges. Passive resistive loads are less expensive than FET driven electronic loads, however, the former are not capable of operating under a wide variety of voltage and current ranges found with FET driven electronic loads. In addition, FET drive dynamic electronic loads are much more expensive than passive resistive load modules. Thus, there remains a need for a hybrid load system that has the versatility of a dynamic electronic load with the cost-effectiveness of a passive resistive load.

SUMMARY OF THE INVENTION

In one embodiment, a hybrid load system includes a dynamic electronic load having FET circuits, such as the dynamic electronic loads sold under the trademark DYNALOAD by TDI Power of Hackettstown, N.J. The dynamic electronic load is integrated with one or more CANBus controlled XBL resistive load modules. In one embodiment, the resistive load modules are high power resistive elements whose operation is completely controlled by a central processing unit disposed within the dynamic electronic load module. In one embodiment, the hybrid load system utilizes multiple measurement parameters and internal software logic to automatically "decide" when the passive resistive elements should be applied in parallel with the dynamic electronic load and subsequently issues a command via a CANBus communication interface to one or more of the passive resistive load modules in the system. The selected passive resistive load modules are switched into a measurement circuit and the desired load is created.

Although the present invention is not limited by any particular theory of operation, it is believed that the hybrid load system of the present invention allows for a plurality of passive resistive load units to be linked for creating load banks of 400 KW or more. The hybrid load system has a cost that is expected to be about 50% of the cost of a conventional FET driven load system. The hybrid load system of the present invention also has improved reliability when used in high power systems due to a reduction in the number of semiconductor components that are required, while still providing the sophisticated communication and measurement interfaces of a DYNALOAD unit.

In one embodiment, a hybrid load system includes a dynamic electronic load module, a plurality of passive resistive modules coupled with the dynamic electronic load module, and a control system in communication with the dynamic electronic load module and the passive resistive modules for determining when and how many of the passive resistive modules should be applied in parallel with the dynamic electronic load module for creating a desired load. In one embodiment, the control system is disposed within the dynamic electronic load module.

In one embodiment, the dynamic electronic load module is a master module for controlling operation of the hybrid load system and the passive resistive modules are slave modules adapted to receive orders from the master, dynamic electronic load module. In one embodiment, the dynamic electronic load module comprises one or more field effect transistor (FET) circuits. The dynamic electronic load module includes a front panel having an operator interface for controlling operation of the hybrid load system. The operator interface preferably includes at least one visual display and at least one engageable element, such as buttons and/or knobs, for controlling operation of the hybrid load system.

In one embodiment, each of the passive resistive modules has a capacity of between about 10 KW-100 KW. In one highly preferred embodiment, each of the passive resistive modules has a capacity of about 10-15 KW, and more preferably about 12 KW. In one embodiment, the passive resistive modules are connected in parallel with one another, and are adapted to be applied to a measurement circuit via individual switches. The passive resistive modules are connected with the dynamic electronic load module through the measurement circuit. In one embodiment, the measurement circuit has switches for selectively applying one or more of the passive resistive modules with the measurement circuit controlled by the CPU of the dynamic electronic load module.

In one embodiment, an electronic load system includes a measurement circuit, a dynamic electronic load module coupled with the measurement circuit and adapted to operate over a range of load levels, and a plurality of passive resistive modules in parallel with one another and in parallel with the dynamic electronic load module via the measurement circuit. Each of the passive resistive modules preferably has a fixed load level. The electronic load system preferably includes a controller for selectively applying one or more of the passive resistive modules with the measurement circuit for achieving a desired load. In one embodiment, adding the passive resistive modules to the measurement circuit provides a mechanism for making gross adjustments to the load level, and the dynamic electronic load provides a fine adjustment mechanism for the load level.

In one embodiment, the dynamic electronic load module includes a central processing unit for controlling operation of the electronic load. The dynamic electronic load module includes a front panel having a control interface for conducting a load test. The central processing unit preferably includes one or more logic routines that apply one or more of the passive resistive modules to the measurement circuit including the dynamic electronic load for achieving a desired load. In one embodiment, the dynamic electronic load desirably includes semiconductor circuits such as field effect transistor (FET) circuits. In one embodiment, each of the passive resistive modules preferably includes at least one resistor having a fixed resistance.

In one embodiment, a method of testing a power source includes providing a measurement circuit including a dynamic electronic load capable of operating over a range of loads, and providing a plurality of passive resistive load modules having fixed load levels, whereby the passive resistive load modules are in parallel with the dynamic electronic load. The method desirably includes adding one or more of the passive resistive loads to the measurement circuit for attaining a desired load. The method may include providing a system controller in communication with the dynamic electronic load for determining how many of the passive resistive load modules are to be coupled with the dynamic electronic load.

These and other preferred embodiments of the present invention will be described in more detail below.

DETAILED DESCRIPTION

Figure 1A:
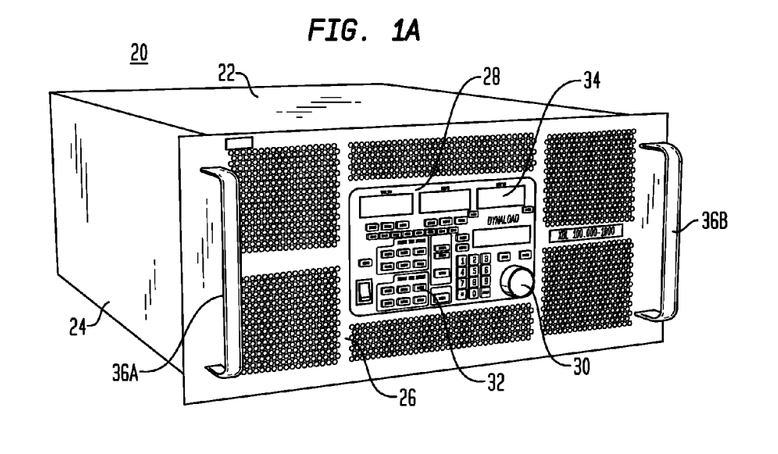
FIG. 1A shows a perspective view of a hybrid load system including a dynamic electronic load, in accordance with one embodiment of the present invention.
Figure 1B:
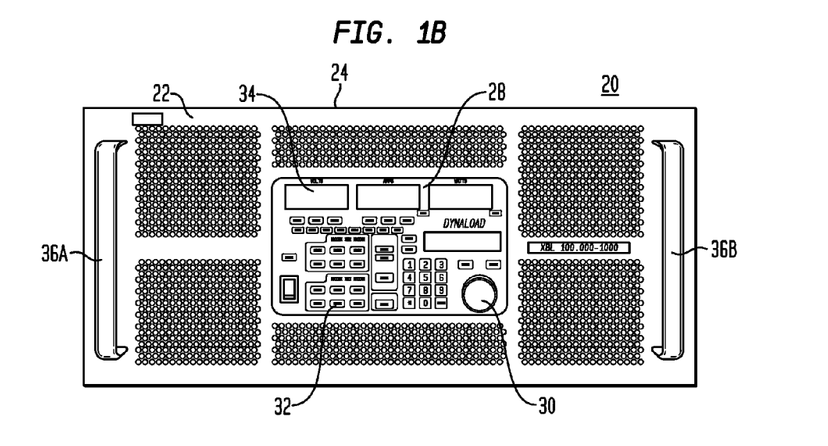
FIG. 1B shows a front elevational view of the dynamic electronic load of FIG. 1A.

Referring to FIGS. 1A and 1B, in one embodiment, a hybrid load system 20 includes a dynamic electronic load unit 22, such as the dynamic electronic load unit sold under the trademark DYNALOAD by TDI Power of Hackettstown, N.J. The dynamic electronic load unit 22 includes a protective case 24 having a front face 26 with a user interface 28. The user interface 28 preferably includes one or more control knobs 30 and one or more depressible buttons 32 for operating the dynamic electronic load unit 22 and the hybrid load system 20. The user interface 26 desirably includes one or more visual displays 34 for displaying operational information such as volts, amps, watts, and mode. The front face 26 of the case 24 preferably includes a pair of handles 36A, 36B for securing and moving the dynamic electronic load unit 22.

Figure 2:
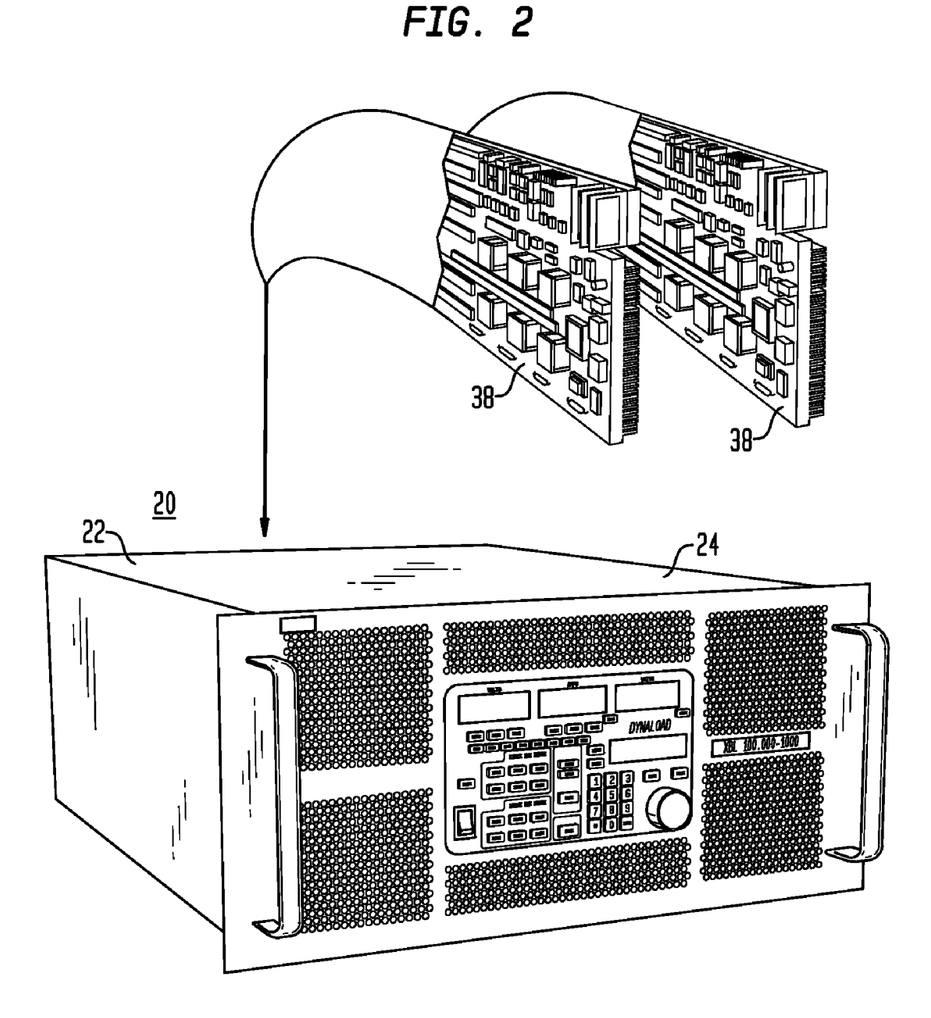
FIG. 2 shows a partially exploded view of the dynamic electronic load of FIGS. 1A and 1B.

Referring to FIG. 2, in one embodiment, the dynamic electronic load unit 22 uses field effect transistor (FET) circuits 38 that are installable inside the protective case 24. In one embodiment, the dynamic electronic load unit 22 may be controlled by a computer or manually programmed for developmental or production applications in constant current, constant resistance, constant voltage, constant power and/or pulse modes to characterize and test the steady state and transient response characteristics of electrical power sources.

Figure 3:
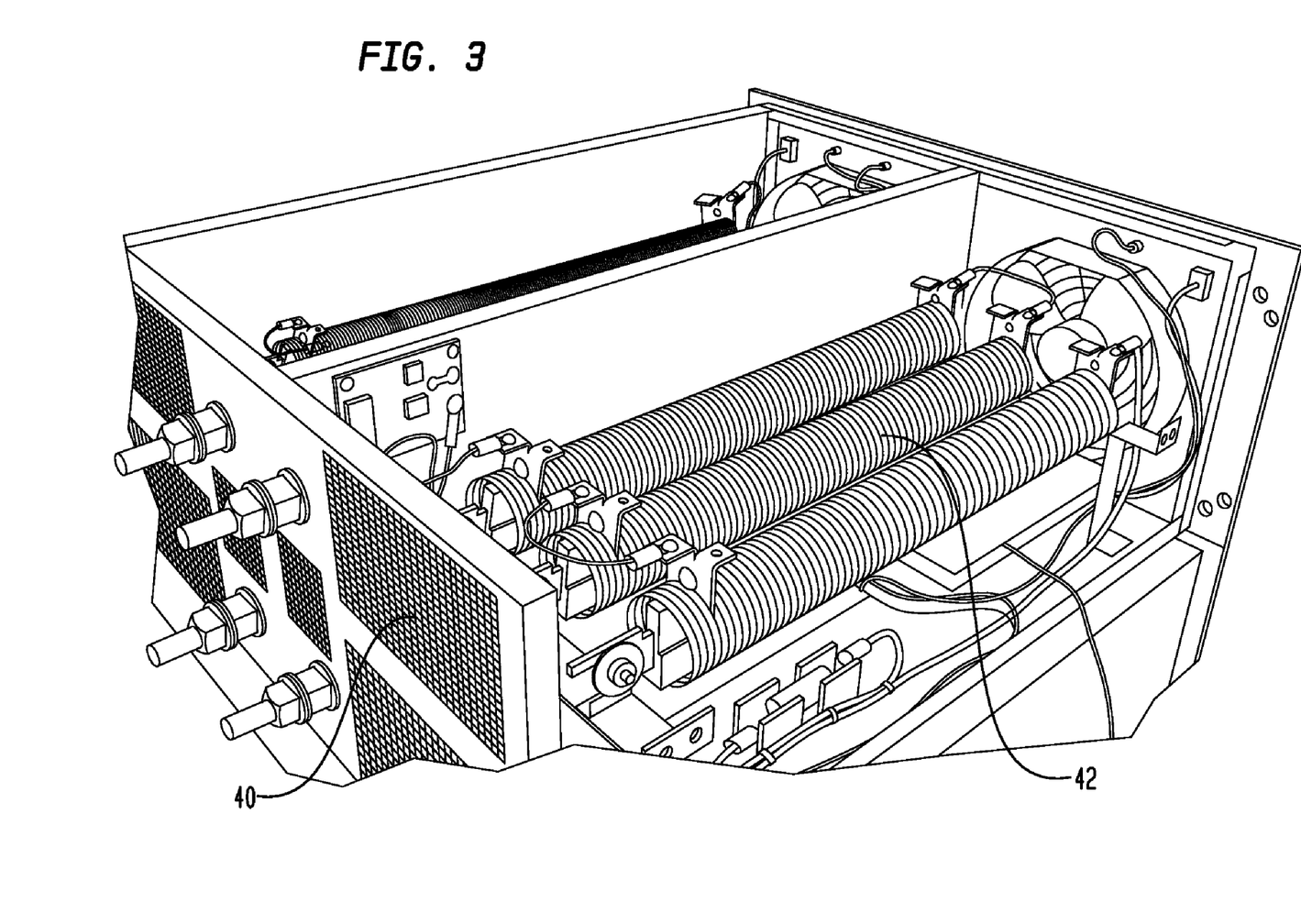
FIG. 3 shows a perspective view of a passive resistive module for a hybrid load system, in accordance with one embodiment of the present invention.

Referring to FIG. 3, in one embodiment, the hybrid load system 20 includes one or more passive resistive modules 40 having resistors 42 disposed therein. The one or more passive resistive modules are preferably coupled with and controlled by the dynamic electronic load unit 22 shown and described above in FIGS. 1A, 1B and 2. The passive resistive modules are preferably coupled in parallel with one another and are slave units that are controlled by a central processing unit disposed within the dynamic electronic load unit. In one embodiment, each of the passive resistive modules 40 has a fixed resistance level. The fixed resistance levels may be the same or different. The passive resistive modules are in parallel with one another and may be coupled with a circuit in sequence for increasing resistance levels in a series of steps.

Figure 4:
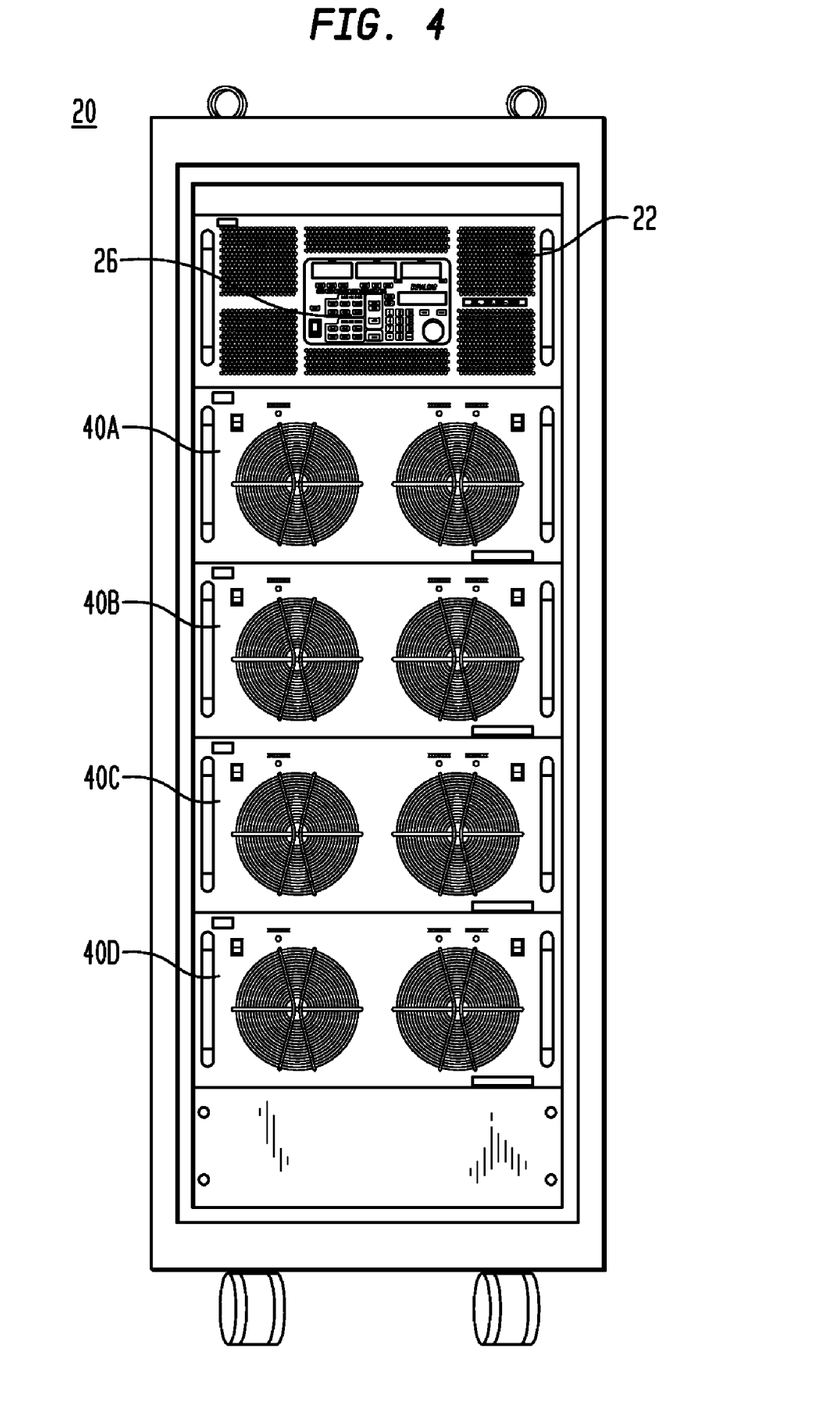
FIG. 4 shows a front elevational view of a hybrid load system including the dynamic electronic load of FIG. 1A and the passive resistive module of FIG. 3, in accordance with one embodiment of the present invention.

Referring to FIG. 4, in one embodiment, a hybrid electronic load 20 includes a dynamic electronic load unit 22 connected in parallel with a plurality of passive resistive modules 40A-40D. The dynamic electronic load unit 22 preferably includes an operator interface 28 that enables an operator run the hybrid load system 20 for testing devices such as power sources. As will be described in more detail below, the dynamic electronic load unit 22 is significantly more expensive than the passive resistive modules 40A-40D. This is due, in part, to the components used to build the different parts of the hybrid electronic load. In one embodiment, the dynamic electronic load unit 22 is built using more expensive "smart" parts such as FET circuits. In contrast, the passive resistive modules 40A-40D are built using less expensive parts such as simple "dummy" resistor elements. The present invention seeks to perform the same functions as a conventional dynamic electronic load, e.g. load testing, while using a hybrid combination of "smart" and "dummy" parts that are less expensive.

As is well-known to those skilled in the art, a conventional dynamic electronic load unit, such as a FET driven unit, has a cost of about $3/watt for an air-cooled unit and about $1/watt for a water-cooled unit. Thus, a 100 KW dynamic electronic load system may cost between about $100,000 to about $300,000. The cost is due, in part, to the need for relatively expensive parts such as FET circuits and a central processing unit (CPU). In contrast, a 100 KW passive resistive unit having a fixed resistance level is less expensive than a 100 KW dynamic electronic load. This is because the fixed resistive units do not require the expensive parts, e.g. FET circuits, found in dynamic electronic loads. Although the present invention is not limited to any particular theory of operation, it is believed that combining one or more fixed resistive "slave" units with a dynamic electronic load "master" unit achieves the cost benefits associated with using fixed resistor parts with the control and "smarts" achieved when using a conventional dynamic electronic load unit.

In one embodiment of the present invention, a 100 KW hybrid load system includes one 12 KW dynamic electronic load unit that is in parallel with eight (8) 12 KW passive resistive units. If a 50 KW load is required, the hybrid load system uses four of the 12 KW passive resistive units to attain a load of 48 KW, and the 12 KW dynamic electronic load is used to attain the remaining 2 KW of load for a total of 50 KW. If a 100 KW load is required, eight of the 12 KW passive resistive units are used to attain 96 KW of the load, and the 12 KW dynamic electronic load is used to attain the remaining 4 KW of load. Thus, the passive resistive modules provide gross adjustment capabilities and the dynamic electronic load unit provides fine adjustment capabilities.

In one embodiment, the present invention achieves the versatility of an expensive 100 KW dynamic electronic load, while using a system having a much lower cost. As noted above, a conventional 100 KW FET driven dynamic electronic load costs about $100,000-300,000. In contrast, a 100 KW hybrid load system according to the present invention costs about $50,000, namely $36,000 for the 12 KW dynamic electronic load unit and $14,000 for the passive resistive units. Thus, the hybrid system of the present invention may achieve the same performance levels found in dynamic electronic loads, such as FET driven electronic loads, while obtaining a significant cost savings (e.g. $50,000-250,000).

Figure 5:
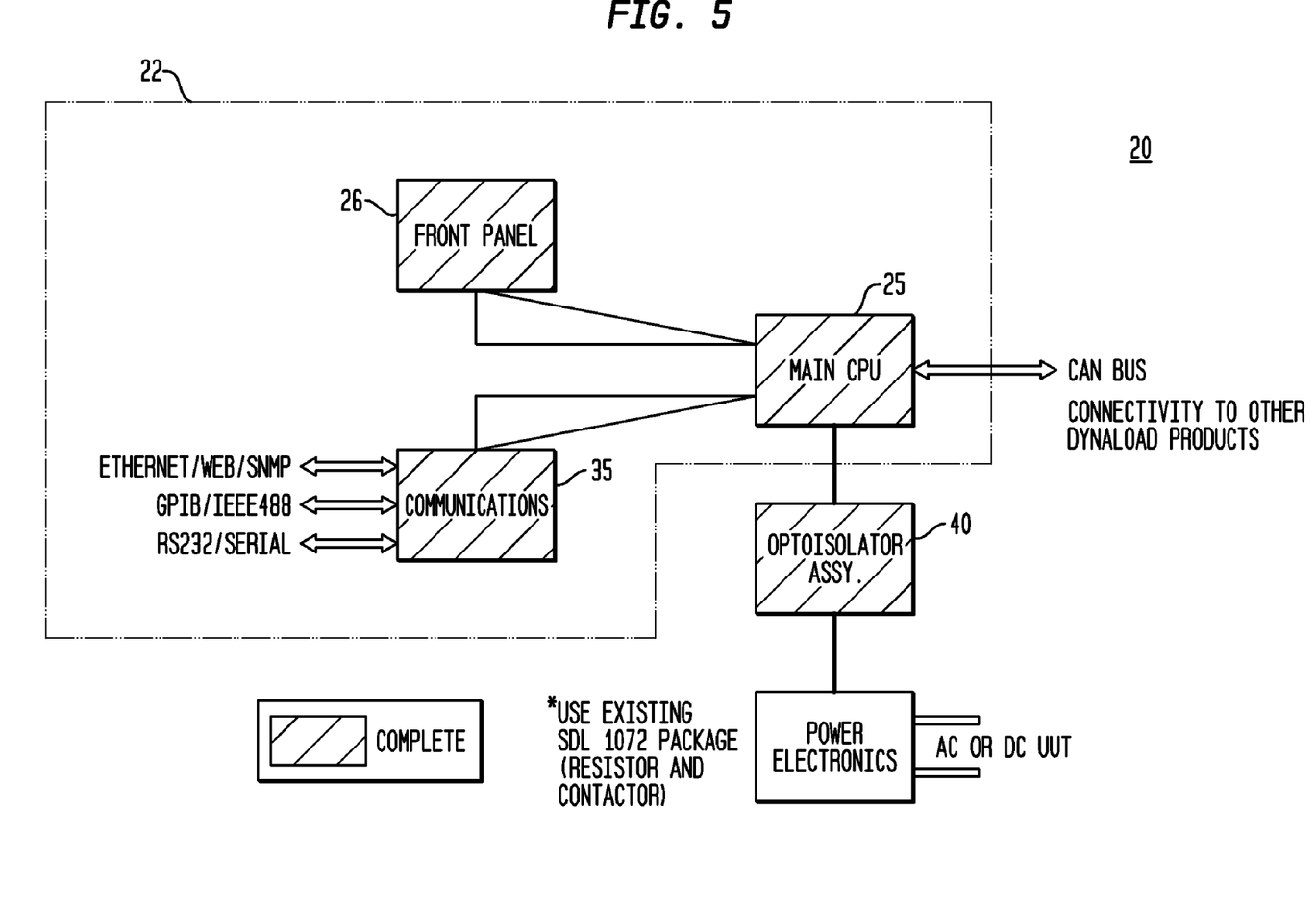
FIG. 5 shows a schematic view of a hybrid load system, in accordance with one embodiment of the present invention.

Referring to FIG. 5, in one embodiment, a hybrid electronic load 20 includes the dynamic electronic load 22. The dynamic electronic load includes a central processing unit 25, the front panel 26 with a user interface, and a communications link 35. The hybrid electronic load 20 also includes a bank of passive resistive modules 40 that are slave units and that take orders from the CPU of the dynamic electronic load. As need, the CPU couples one or more of the passive resistive modules 40 with the dynamic electronic load unit 22 via a measurement circuit for generating the desired voltage or current level.

Figure 6:
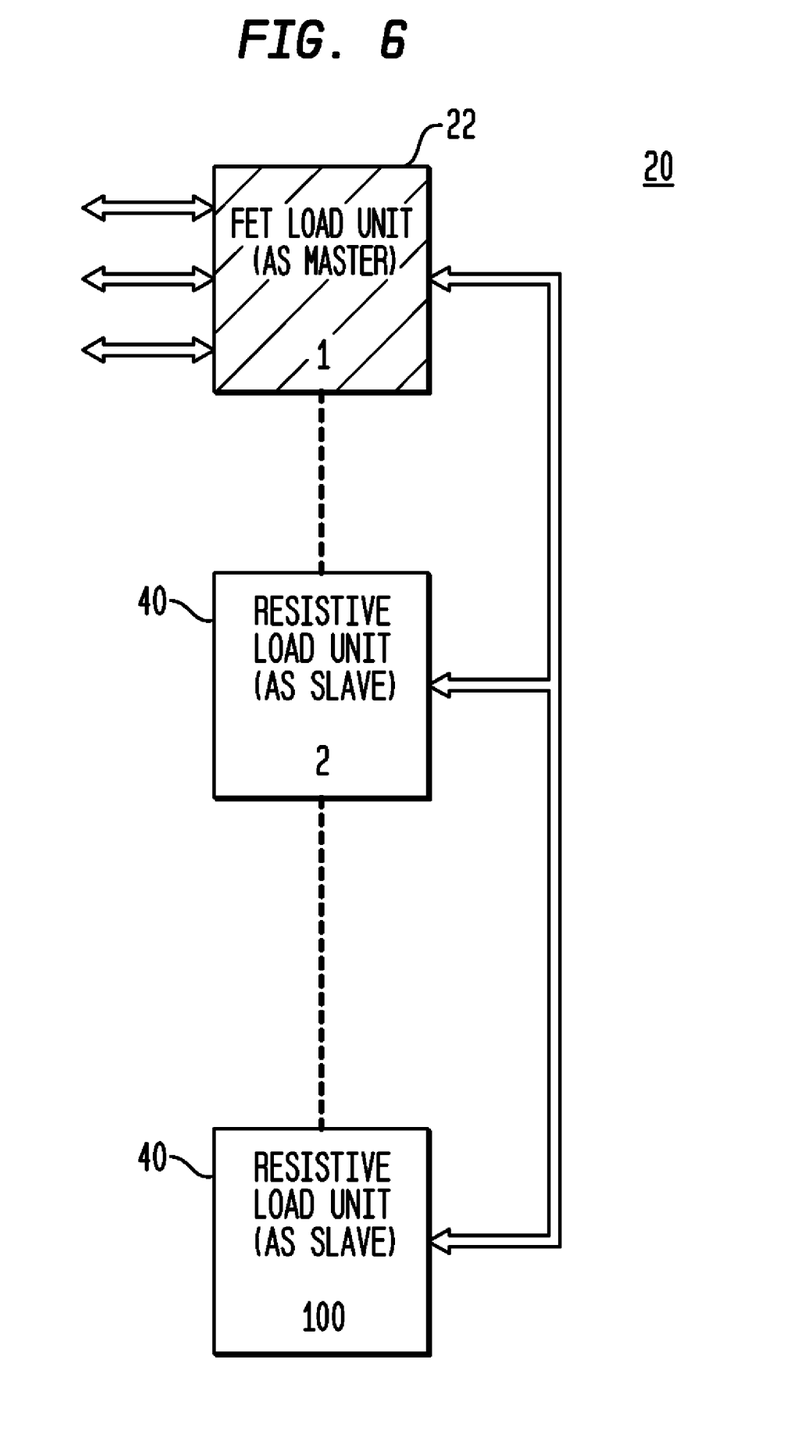
FIG. 6 shows a schematic view of a hybrid load system including a dynamic electronic load and a plurality of passive resistive loads, in accordance with one embodiment of the present invention.

Referring to FIG. 6, in one embodiment, a hybrid electronic load 20 includes a master dynamic electronic load 22 coupled in parallel with a plurality of passive resistive load units 40. The number of resistive load units 40 may vary. In one embodiment, the number of resistive load units 40 may be up to 100 or more resistive load units.

Figure 7:
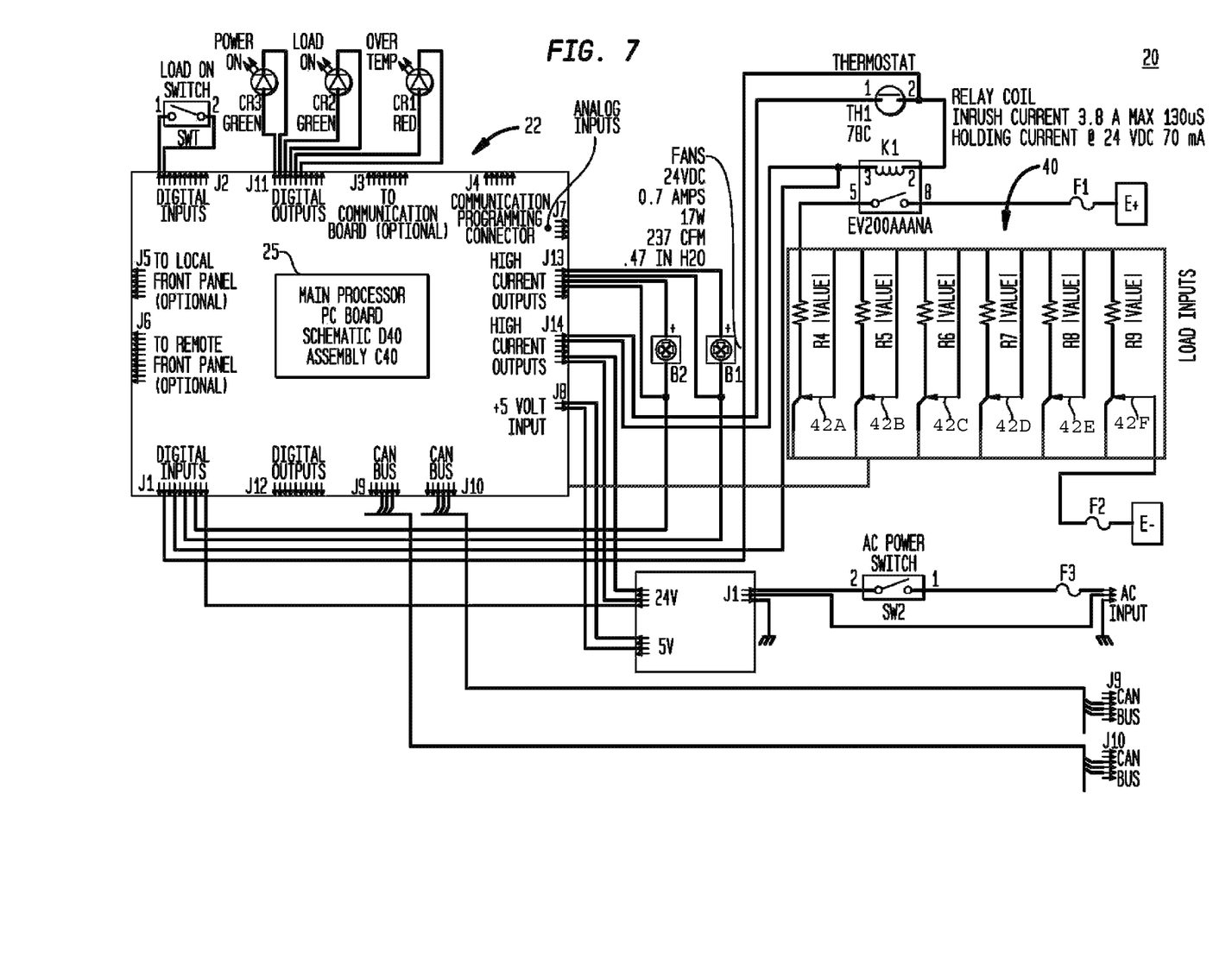
FIG. 7 shows a circuit for a passive resistive load, in accordance with one embodiment of the present invention.
Figure 8:
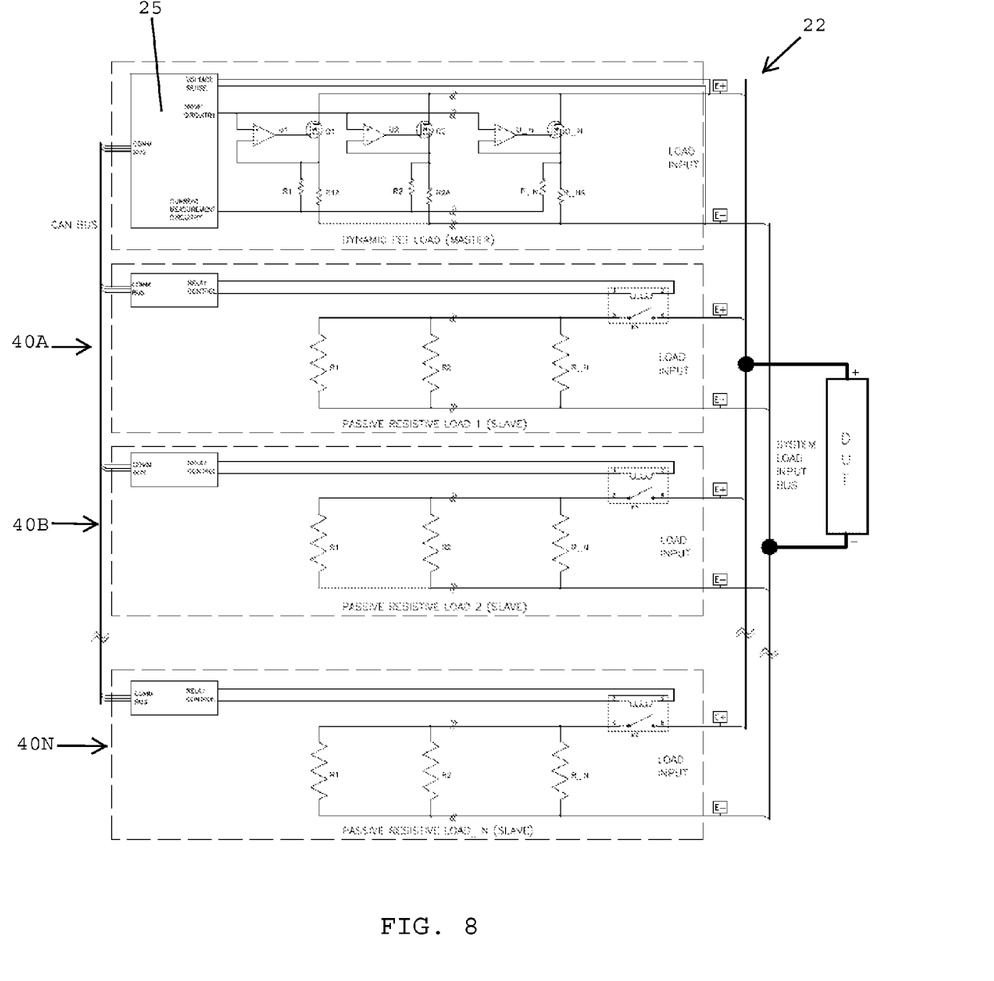
FIG. 8 shows a circuit drawing for a hybrid load system including a dynamic electronic load and a plurality of passive resistive loads, in accordance with one embodiment of the present invention.

Referring to FIGS. 7 and 8, in one embodiment, a measurement circuit for a hybrid load system includes a dynamic electronic load unit 22, such as a DYNALOAD unit sold by TDI Power, coupled with six passive resistive load units 40A, 40B, ... 40N. The passive resistive load units 40A, 40B, ... 40N are preferably in parallel with one another and in parallel with the dynamic electronic load unit 22. A central processing unit 25 determines how many of the passive resistive units 40A, 40B, ... 40N must be added to the measurement circuit to achieve the desired voltage or current level. In the embodiment shown in FIG. 7, the passive resistive load unit 40 has six resistors 42A-42F.

In one embodiment, the hybrid load system may be used to test batteries by both analyzing life cycle and establishing the voltage and current characteristics of the batteries. The hybrid load system may be operated in the constant current mode which freezes one of the variables when calculating the battery's power level. In one embodiment, batteries require exotic waveform testing in order to simulate real life uses. This form of testing may be accomplished by using an internal pulse generator (not shown). Many different waveforms may be created through the use of variable current levels, frequency, duty cycle, and slew rate. The load may be controlled through the analog remote programming input for situations where the required waveforms are extremely complex. This input, scaled from zero (0) to 10 volts, is directly proportional to the selected full-scale current.

In one embodiment, the hybrid load system may be operated in the constant power mode to test batteries designed for UPS backup systems. This mode emulates the changing current demand as the battery voltage decays, which are characteristic of both DC to DC converters and inverter input simulations.

In a constant current or constant voltage mode, the hybrid load system may be used for characterizing power output versus hydrogen flow rates. The pulse mode may be used to determine the effects of instantaneous current change, thereby assisting in establishing stability under real world applications. With its high speed response characteristics, the hybrid load system may be used to determine the output impedance of a fuel cell. Two established methods may include a current dump method and a sine wave method. The current dump method requires the load to transition from a peak current to zero current in less than 10 microseconds. The internal impedance may be derived from the rate of voltage rise of the fuel cell. In one embodiment, a sine wave method requires a sine wave current and the measurement of the phase angle between the current and voltage waveforms. This is less dramatic than the current dump method, however, the results are the same. The hybrid load system may also be used for fuel cell life cycle testing.

In a constant current mode, the hybrid load system may be used for power supply testing, load regulation of constant voltage sources, V/I characterization of batteries and fuel cells, V/I characterization of solar cells, discharge cycling of batteries, RPM/V/I characterization of alternators and generators, circuit breaker and fuse testing, current regulation for electro-plating, and current regulation for shunt manufacturing.

In a constant resistance mode, the hybrid load system may be used for power supply testing, load regulation of constant voltage and constant current sources, power supply testing, and characterization of current limit foldback circuitry. In a constant voltage mode, the hybrid system may be used for battery simulation for chargers, and shunt regulator applications. In a constant power mode, the hybrid load system may be used for DC-DC simulation for battery backup simulation. In a pulse mode, the hybrid load system may be used for transient response characterization of power supplies, and internal impedance determination for fuel cells and batteries.

Power supply testing. For basic testing, the electronic load may be used to simulate many current levels in both constant current mode and constant resistance mode. The load regulation at various current levels is obtained by monitoring the change in output voltage. The electronic load may also be used to determine the current limit characteristics down to the point of short circuit current. The response characteristics of the power supply may be analyzed with the use of an oscilloscope when operating in pulse mode. Characteristics such as loop response, overshoot, undershoot, and load regulation may be determined from a single high-speed current pulse. When testing a battery charger, the constant voltage mode preferably verifies the operation of the charger into a constant voltage load, thus simulating a battery.

Battery Testing. The electronic load may be used to test batteries by both analyzing life cycle and establishing the voltage and current characteristics. In one embodiment, the load is operated in the constant current mode which freezes one of the variables when calculating the battery's power level. Some batteries require exotic waveform testing in order to simulate real life uses, which may be accomplished by using the electronic load's internal pulse generator. Many different waveforms can be created through the use of variable current levels, frequency, duty cycle, and slew rate.

The load may be controlled through the analog remote programming input for situations where the required waveforms are extremely complex. This input, scaled zero to 10 volts, is directly proportional to the selected full-scale current.

The constant power mode may be used to test batteries designed for uninterrupted power supply (UPS) backup systems. This mode emulates the changing current demand as the battery voltage decays. These are the characteristics of both DC to DC converters and inverter input simulations.

In one embodiment, DC sources, such as solar cells, generators and alternators, may be characterized using the electronic load of the present invention. Each may be characterized based on its input source, such as light conductance or RPM.

In one embodiment, the hybrid load system may be used as a current regulator when connected in series with a bulk power source. In this configuration, the hybrid load system may be used to regulate the current in plating operations, circuit breakers, fuses or battery charging. The hybrid load system may also be used to control the current for shunt manufacturing and calibration.

In one embodiment, an air cooled hybrid load system is available with voltage ratings as high as 1000 volts, whereas other models can be loaded up to 1000 amperes from a 0.5 volt source for fuel cell, battery cell, solar cell and low voltage power source development and testing. Air cooled hybrid load systems are available with power ratings from a few hundred watts per channel or module up to 4 KW/module. In one embodiment, multiple channel loads are available for testing multiple output power supplies or simultaneously testing several power supplies in production or burn-in. Water cooled hybrid load systems are available with power ratings up to 12 KW/module and they may be operated in a Master/Slave configuration with passive resistive modules to create a 120 KW dynamic load in a standard rack.

In one embodiment, a constant resistance mode may be used for power supply regulation, overload and short circuit testing. The constant current mode may be used for circuit breaker and current shunt testing. The constant power mode may be used to test batteries or simulate a constant power load such as a switching regulator. The constant voltage mode may be used to simulate a battery to test a battery charger and the pulse loads measure the transient response of the power source.

In one embodiment, a water cooled hybrid load system is rated at 12 KW with a selection of voltage and current ratings applicable to the test requirements, i.e. 50V, 100V, 400V, and 800V modules. The master dynamic electronic load programs itself, and the slave passive resistive loads follow. The master and slave modules may be arrayed in a rack to create specific systems for the application up to 120 KW/rack. In certain preferred embodiments, racks are 44 or 60" high×22" wide× 36" deep.

In one embodiment, once the modules are in a sub-rack, the modules are user configurable. The dynamic electronic load and the passive resistive modules can be paralleled using the paralleling straps provided, configured either from the front panel or computer bus, and controlled as a single channel. 350 watt and 175 watt modules may be used in any configuration, providing maximum flexibility. All functions that are available for a single module are available in the multi-channel configuration.

While the foregoing is directed to embodiments of the present invention, other and further embodiments of the invention may be devised without departing from the basic scope thereof.

What is claimed is:

1. A hybrid load system comprising:
a circuit;
a dynamic electronic load module connectable with said circuit for increasing the resistance of said circuit, said dynamic electronic load module comprising one or more field effect transistors (FET) that provide a variable resistance within a predetermined range;
a plurality of passive resistive modules connectable with said circuit for increasing the resistance of said circuit, each said passive resistive module having no field effect transistors (FET) and including one or more resistors that provide a fixed resistance level that remains constant, wherein each said passive resistive module has a switch that is opened for disconnecting said passive resistive module from said circuit for applying no resistance to said circuit and that is closed for connecting said passive resistive module with said circuit for adding the fixed resistance level of said passive resistive module to said circuit;
a central processing unit in communication with said dynamic electronic load module and said passive resistive modules, wherein said central processing unit controls the variable resistance from said dynamic electronic load module added to said circuit and how many switches on said passive resistive modules are closed, wherein the total resistance of said circuit equals the sum of said variable resistance from said dynamic electronic load module and the fixed resistance levels from said respective passive resistive modules connected with said circuit, and wherein the total resistance of said circuit increases by one of the fixed resistance levels of said respective passive resistive modules each time another one of said switches is closed, wherein to establish a desired resistance value n number of passive resistive module switches are closed to provide an effective resistance, wherein n=the number required to reduce the difference between the desired resistance value and the effective resistance to within the predetermined range of said dynamic electronic load module, and wherein said dynamic electronic module is controlled to provide the difference.

2. The hybrid load system as claimed in claim 1, wherein said central processing unit is disposed within said dynamic electronic load module.

3. The hybrid load system as claimed in claim 1, wherein said central processing unit disposed within said dynamic electronic load module controls operation of said hybrid load system and said passive resistive modules are slave modules adapted to receive orders from said central processing unit.

4. The hybrid load system as claimed in claim 1, wherein said dynamic electronic load module includes a front panel having an operator interface for controlling operation of said hybrid load system.

5. The hybrid load system as claimed in claim 4, wherein said operator interface includes at least one visual display and at least one engageable element for controlling operation of said hybrid load system.

6. The hybrid load system as claimed in claim 1, wherein said hybrid load system has a total capacity of 100 KW, wherein said dynamic electronic load module has a variable capacity having a range between 0-12 KW, wherein each of said passive resistive modules has a fixed capacity of 12 KW, and wherein the total load generated by said hybrid load system increases by 12 KW each time another one of said passive resistive modules is connected with said circuit.

7. The hybrid load system as claimed in claim 1, further comprising a measurement circuit and wherein said switches are closed for selectively connecting one or more of said passive resistive modules with said measurement circuit.

8. The hybrid load system as claimed in claim 1, wherein each said passive resistive module has a plurality of resistors, and wherein closing said switch associated with one of said passive resistive modules adds all of said plurality of resistors to said circuit.

9. A 100 KW hybrid load system comprising:
a measurement circuit;
a 12 KW dynamic electronic load module connectable with said measurement circuit for increasing the load on said measurement circuit, said dynamic electronic load module comprising field effect transistor (FET) circuits that provide a variable load within a range of load levels between 0-12 KW;
a plurality of passive resistive modules connectable with said measurement circuit for increasing the load on said measurement circuit, each said passive resistive module having no field effect transistor (FET) circuits and including one or more resistors that provide a constant load of 12 KW, wherein each said passive resistive module has a switch that is opened for disconnecting said passive resistive module from said measurement circuit for applying zero load to said measurement circuit and that is closed for connecting said passive resistive module with said measurement circuit for adding said constant load of 12 KW to said measurement circuit;
a central processing unit in communication with said dynamic electronic load module and said passive resistive modules, wherein said central processing unit controls the variable load of said dynamic electronic load module added to said measurement circuit and how many switches for said respective passive resistive modules are closed, wherein the total load on said measurement circuit equals the sum of said variable load from said dynamic electronic load module and the total number of said constant loads of 12 KW from said passive resistive modules connected with said measurement circuit, and wherein the total load on said measurement circuit increases by 12 KW each time another one of said switches is closed for connecting another one of said passive resistive modules to said measurement circuit, wherein to establish a desired load value n number of passive resistive module switches are closed to provide an effective load, wherein n=the number required to reduce the difference between the desired load value and the effective load to within the range of said dynamic electronic load module, and wherein said dynamic electronic module is controlled to provide the difference.

10. The hybrid load system as claimed in claim 9, wherein each said passive resistive module has a plurality of resistors, and wherein said switch associated with one of said passive resistive modules adds all of said plurality of resistors to said measurement circuit.

11. The electronic load as claimed in claim 9, wherein said dynamic electronic load module comprises a front panel including a control interface for conducting a load test.

12. The electronic load as claimed in claim 11, wherein said central processing unit includes one or more logic routines that connect said dynamic electronic load module and one or more of said passive resistive modules to said measurement circuit for achieving a desired load.

13. The electronic load as claimed in claim 9, wherein each of said passive resistive modules has a fixed resistance that remains constant.

14. A method of testing a power source comprising:
providing a measurement circuit;
providing a dynamic electronic load module connectable with said measurement circuit for applying a load on said measurement circuit, said dynamic electronic load module having field effect transistor (FET) circuits that generate a variable load within a predetermined range;
providing a plurality of passive resistive load modules having fixed load levels that remain constant, wherein each said passive resistive load module has a switch that is opened for disconnecting said passive resistive load module from said measurement circuit for applying no load on said measurement circuit and that is closed for connecting said passive resistive load module with said measurement circuit for adding said fixed load level of said passive resistive load module to said measurement circuit;
closing one or more of said switches for connecting said passive resistive load modules associated with said closed switches to said measurement circuit for increasing the load on said circuit, wherein variable adjustments to said load are made using said dynamic electronic load module and fixed level adjustments to said load are made using said passive resistive load modules; and
increasing said load on said measurement circuit by an increment equal to one of said fixed load levels each time another one of said switches is closed for connecting one of said passive resistive load modules with said measurement circuit establishing a desired load value;
closing n number of passive resistive module switches to provide an effective load, wherein n=the number required to reduce the difference between the desired load value and the effective load to within the predetermined range of said dynamic electronic load module; and
controlling said dynamic electronic module to generate the difference.

15. The method as claimed in claim 14, wherein each said passive resistive module has a plurality of resistors, the method further comprising closing said switch associated with one of said passive resistive modules for adding all of said plurality of resistors to said measurement circuit.

16. The method as claimed in claim 14, further comprising providing a central processing unit in communication with said dynamic electronic load module for determining how many of said passive resistive load modules are to be connected with said measurement circuit, and increasing said desired load by an amount of about 10-15 KW each time another one of said passive resistive modules is connected with said measurement circuit.

* * * * *